United States Patent [19]

Moffatt et al.

[11] Patent Number: 4,773,951

[45] Date of Patent: Sep. 27, 1988

[54] METHOD OF MANUFACTURING WAFERS OF SEMICONDUCTOR MATERIAL

[75] Inventors: Alex P. Moffatt, Camarillo; Richard C. Jackson, Oxnard, both of Calif.

[73] Assignee: Atlantic Richfield Company, Los Angeles, Calif.

[21] Appl. No.: 816,923

[22] Filed: Jan. 7, 1986

[51] Int. Cl.⁴ .......................... B24B 1/00; B24B 7/22
[52] U.S. Cl. .................................. 156/153; 51/283 R
[58] Field of Search ............... 156/153, 154, 608, 645; 437/225, 437/226; 51/283 R, 14 R; 83/34–36, 704–705; 82/46, 47

[56] References Cited

U.S. PATENT DOCUMENTS

| | | | |
|---|---|---|---|
| 3,078,549 | 2/1963 | Wende | 51/283 |
| 3,802,412 | 4/1974 | Lane | 125/13 R |
| 4,331,452 | 5/1982 | Causey et al. | 51/283 R X |
| 4,487,989 | 12/1984 | Wakefield et al. | |

Primary Examiner—Jeff H. Aftergut
Attorney, Agent, or Firm—Nilsson, Robbins, Berliner, Carson & Wurst

[57] ABSTRACT

A method of manufacturing wafers of semiconductor material incorporates the steps of: providing an elongated ingot of semiconductor material having a curved surface along the direction of elongation; mounting a structure for ingot mounting on each of the end surfaces of the ingot; positioning the ingot mounting structures on fixture structures to mount the ingot; and rotating the mounted ingot. The positioned ingot mounting structures are released and the ingot is removed from the fixture structures; however, during the course of the process the mounting structures are again positioned on fixture structures to mount the ingot and the ingot is rotated a second time. The method is adapted for accurate centering of the ingot during processing involving the sawing of the ingot to provide opposed elongated planes therealong (including rotation of the ingot in accomplishing such) and involving further rotation of the ingot during grinding. The ingot mounting structures are centered on the basis of crystallographic node lines that appear on the grown ingot. The mounting structures have spherical surface portions for accuracy in centering the ingot in fixtures having conical surface portions to abut the spherical surfaces in mounting the ingot.

31 Claims, 6 Drawing Sheets

FIG. IIA  FIG. IIB

FIG. IIc  FIG. I2A

METHOD OF MANUFACTURING WAFERS OF SEMICONDUCTOR MATERIAL

BACKGROUND OF THE INVENTION

The field of the invention pertains to methods of manufacturing semiconductor devices, such as solar cells, and in particular, to methods of manufacturing wafers of semiconductor material used in manufacturing semiconductor devices.

Much of the relatively high cost of many forms of semiconductor devices is due to the cost of crystalline semiconductor material and the waste of such material in producing semiconductor devices from ingots of the material. Therefore, substantial attention has been given to improving the efficiency of methods of producing semiconductor wafers used in making semiconductor devices. Somewhat related to this, solar cells, one of the common forms of semiconductor devices, having straight sides (e.g., a generally square-shaped configuration) have been found to be desirable for efficient arrangements of solar cells in solar panels.

One conventional approach to providing wafers for such solar cells involves grinding an ingot into a round shape and then sawing pairs of opposed elongated planes along the ingot. The ingot, as grown, of course has a curved surface along its direction of elongation. However, the surface is somewhat irregular. After cropping the ends of the ingot to provide generally flat end surfaces, the ingot is clamped for the above grinding. Attempting to position the ingot in the clamps to reduce wastage in grinding from the irregular to the round shape is typically a far from ideal process. Specifically, typically, feelers along the apparatus help the operator approximately determine the optimal position for the ingot in the clamps to minimize the amount of material ground off in provding the round shape.

In the slabbing process (to provide the opposed elongated planes), similar inaccuracies, resulting in wastage of valuable material, generally prevail. For example, typically, the rounded ingot is centered before clamping along stops under the ingot and also along one side of the ingot. Then the ingot is sawed along its direction of elongation to provide a pair of opposed planes. These planes, in the ideal, would be perfectly parallel. However, due to equipment limitations (e.g., the tendency of the saws to angle outwardly as they move through the ingot), the ideal of course is never attained. After the first pair of opposed planes is provided, one would be typically used in re-positioning the ingot for sawing to provide the second pair of opposed planes. The inaccuracies in that reference plane, coupled with the above-indicated inaccuracies in the sawing itself, serve to compound the error in respect to the sawing to provide the second pair of opposed planes.

U.S. Pat. No. 4,487,989, having the same assignee as the present matter, reveals some helpful variations in, for example, the process just described. Specifically, it reveals the advantages which can be garnered from slabbing the ingot to provide the pairs of opposed planes first and, then, grinding the corner regions to round them off, to flatten them, or, alternatively, eliminating that grinding altogether and leaving the corner regions irregular. However, the difficulty and wastage resulting from the inaccuracies in positioning the ingot for slabbing and grinding, remained unaddressed.

The present invention significantly addresses this area of concern. In the course of doing so, it incorporates the mounting of ingot mounting structures on the cropped ends of an ingot. These structures have particular shapes in connection with particularly shaped fixture structures in which the mounting structures are positioned during processing of the ingot. For accuracy of placement of the mounting structures on the cropped ingot ends, crystallographic node lines are employed for reference purposes. The method incorporates ease of performance, significant savings in material, and the capability for readily meeting desired tolerances for semiconductor wafers.

SUMMARY OF THE INVENTION

In accordance with the invention, a method of manufacturing wafers of semiconductor material, includes the steps of: providing an elongated ingot of semiconductor material having a curved surface along the direction of elongation; mounting a structure for ingot mounting on each of the end surfaces of the ingot; positioning the ingot mounting structures on fixture structures to mount the ingot; and rotating the mounted ingot.

During the course of the manufacturing, the positioned ingot mounting structures are released and the ingot is removed from the fixture structures; however, the mounting structures, later, are positioned on fixture structures a second time to mount the ingot, and a rotating of the ingot is again carried out.

In positioning the ingot mounting structures, at each of the end surfaces of the elongated ingot, a marking operation is carried out, along the straight paths between the positions at such surfaces, of node lines along the ingot. The mounting of each ingot mounting structure then involves centering the structure substantially on the intersection of these described paths. Specifically, notches defined by the mounting structure are aligned substantially along such paths to accomplish this centering.

The shapes of the ingot mounting structures and of the fixture structures on which they are positioned, are important in achieving the desired centering and alignment of the ingot as mounted for processing. Specifically, substantially spherical surface portions of the ingot mounting structures are positioned against substantially conical surface portions of the fixture structures.

In a method of manufacturing wafers of semiconductor material, incorporating the above-described features as well as yet other features of the invention, the end surfaces of the ingot, substantially as grown, are sawed off at least approximately perpendicularly to the direction of elongation of the ingot to define modified end surfaces at least approximately perpendicular to such direction of elongation. The ingot mounting structures are then mounted on these modified end surfaces.

In addition, after initial positioning of the ingot mounting structures on fixture structures to mount the ingot: the ingot is concurrently sawed along its direction of elongation at, at least a first pair of positions to provide a first pair of at least approximately parallel elongated ingot surfaces; the mounted ingot is rotated through an angle of substantially 90 degrees; then the ingot is again concurrently sawed along its direction of elongation at, at least a second pair of positions to provide a second pair of at least approximately parallel elongated ingot surfaces, such second pair of elongated ingot surfaces being at least approximately perpendicular to the first pair. Further, the referenced positions for such sawing are selected to leave, after the sawing, curved ingot surface portions between the pairs of elongated ingot surfaces.

After the positioning of the ingot mounting structures on fixture structures the second time, the curved ingot surface portions, remaining after the sawing to provide the pairs of elongated ingot surfaces, are ground in order to round them off, the mounted ingot undergoing a continual rotation in the course of such grinding.

DETAILED DESCRIPTION

Figure 1:
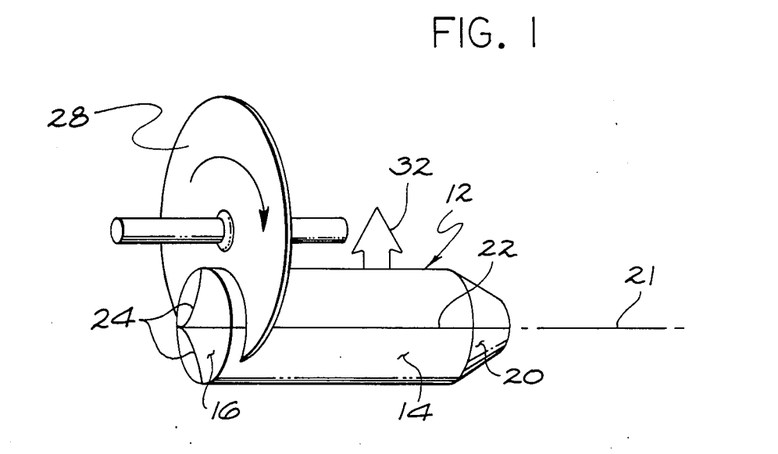
FIG. 1 is a somewhat schematic view of an ingot substantially as grown, schematically illustrating the sawing-off of the ends of the ingot.

By way of introduction, a method of manufacturing wafers of semiconductor material in accordance with the invention is shown and described. Ingot sawing and grinding steps are illustrated in FIG. 1 (sawing-off ingot end surfaces), in FIG. 3 (sawing along the ingot to provide elongated surfaces), in FIG. 5 (grinding remaining curved ingot surfaces between the elongated surfaces to round them off), and in FIG. 6 (repeatedly sawing through the ingot transverse to the direction of elongation to provide wafers).

Figure 2:
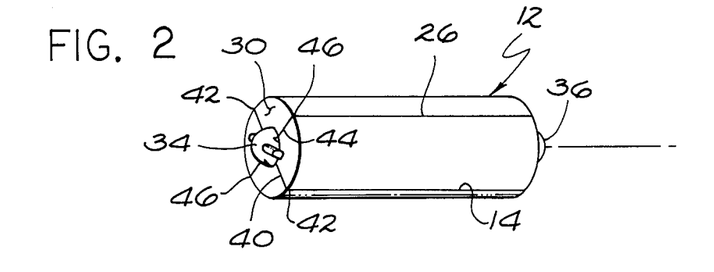
FIG. 2 is a somewhat schematic view of the ingot, showing several node lines along the ingot, a marked end of the ingot, and ingot mounting structures in position on the ingot.
Figures 11A, 11B:
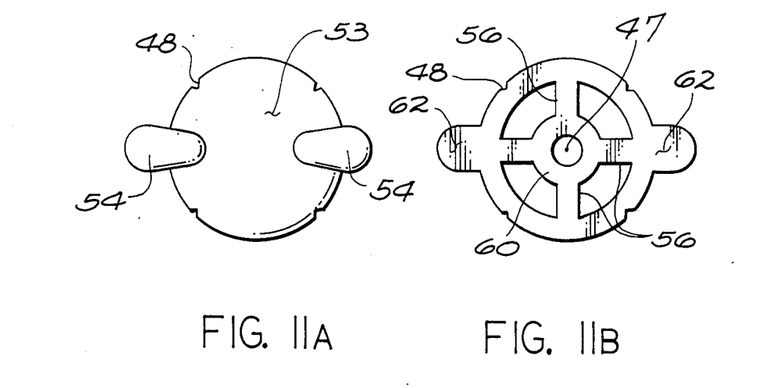
FIGS. 11A-11C are top, bottom and elevational views, respectively, of an ingot mounting structure incorporating lugs for rotational driving.
Figure 11C:
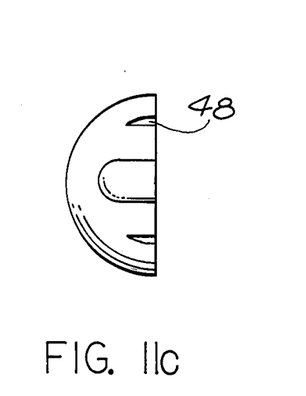

The mounting of ingot mounting structures employing ingot node lines for centering purposes is illustrated in FIG. 2. The detailed forms of two types of mounting structures are shown in FIGS. 11A-11C (with lugs for rotationally driving the ingot) and FIGS. 12A-12C (without such lugs).

Figure 3:
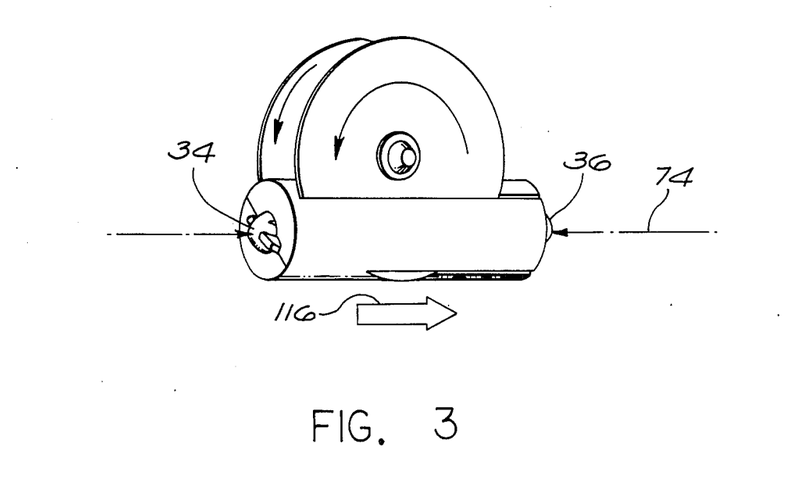
FIG. 3 is a somewhat schematic view of the ingot, schematically showing the sawing of the ingot to provide a pair of elongated ingot surfaces.
Figure 5:
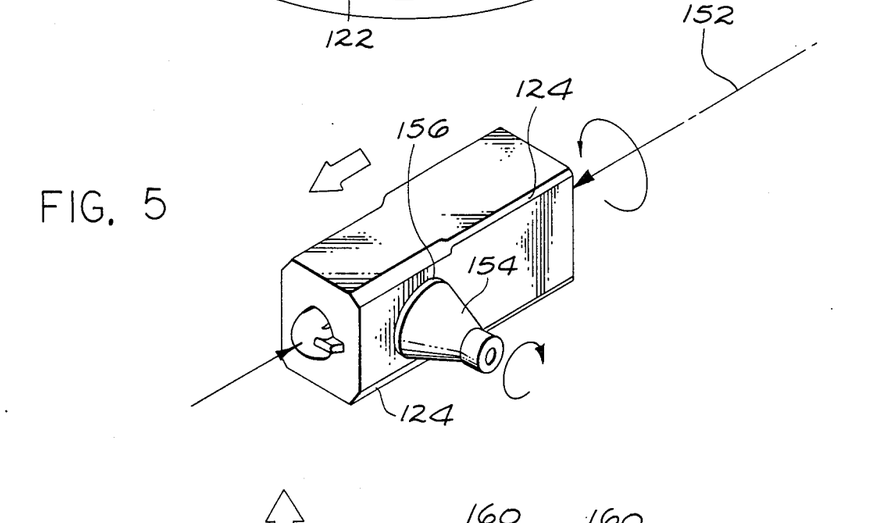
FIG. 5 is a somewhat schematic view of the ingot, schematically showing the grinding of curved ingot surface portions to round off such curved portions.
Figure 7:
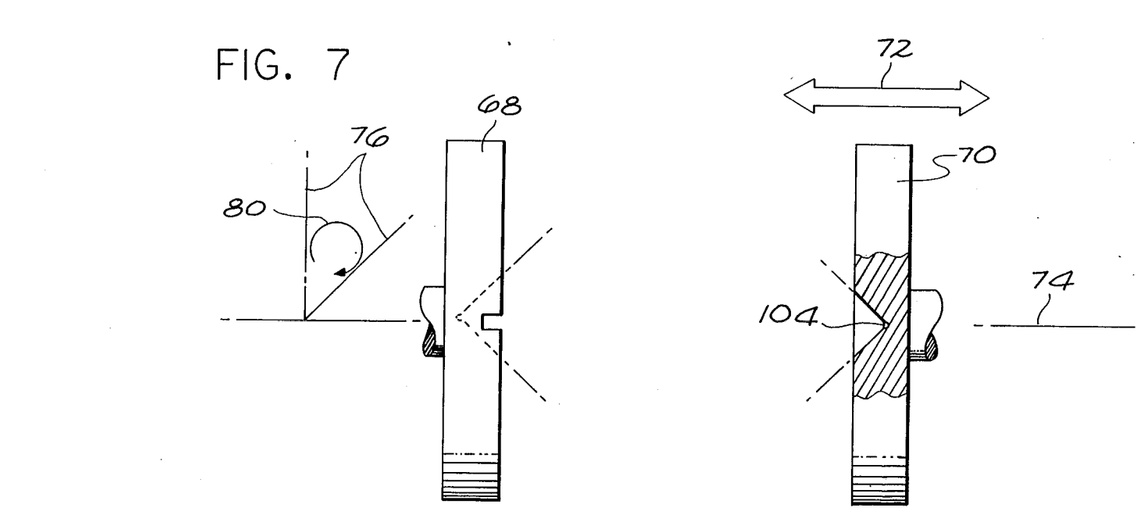
FIG. 7 is a side elevational view, partly in section, showing end fixture structures for mounting the ingot in order to perform the sawing illustrated in FIG. 3. It also schematically illustrates some related aspects.
Figure 8:
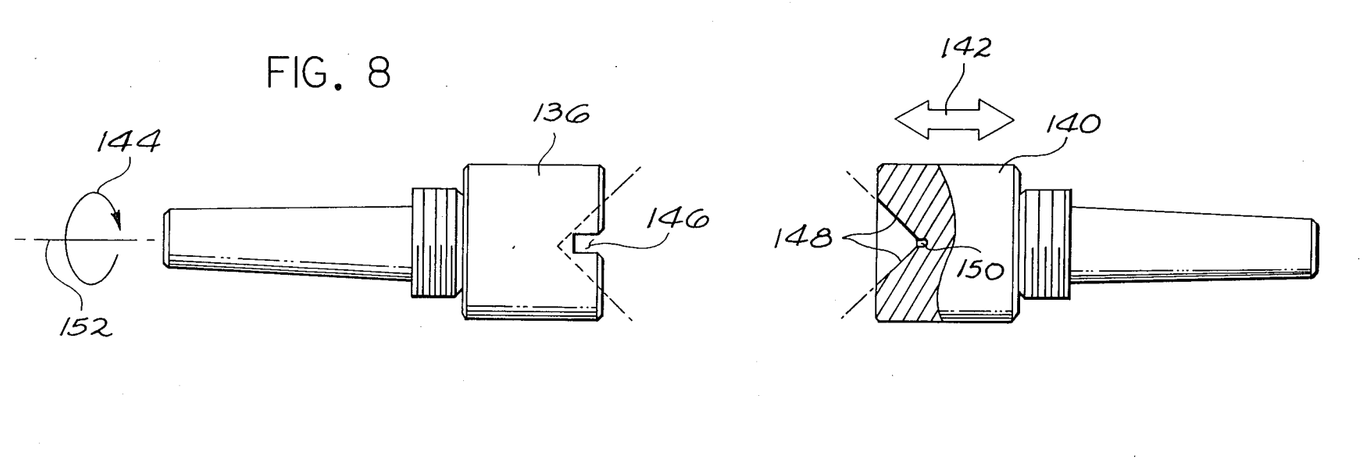
FIG. 8 is a side elevational view, partly in section, showing end fixture structures for mounting the ingot to accomplish the grinding illustrated in FIG. 5. It also schematically illustrates some related aspects.

With reference to the mounting of the ingot for the processing of FIGS. 3 and 5, the inward arrows against the ingot mounting structures indicate the force of the applicable end fixture structures for mounting the ingot (those of FIG. 7 in respect to the processing of FIG. 3 and those of FIG. 8 in respect to the processing of FIG. 5). These different forms of fixture structures exemplify the types of differences which mrght typically exist while the structure which interacts with the ingot mounting structures remains essentially the same.

Figure 4:
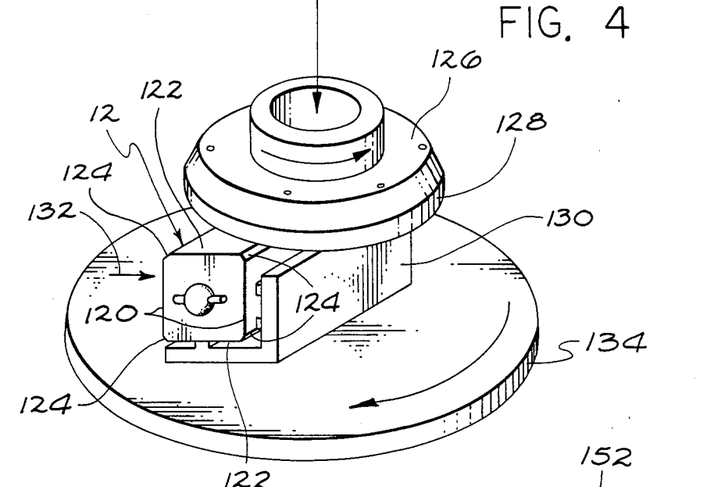
FIG. 4 is a somewhat schematic view of the ingot, schematically illustrating refinement of elongated ingot surfaces, which may be performed.

An additional grinding process to further refine the elongated ingot surfaces is illustrated in FIG. 4. This may be employed, in some circumstances, if additional accuracy is indicated to be necessary or desired.

Now turning to a description of the method in additional detail, and referring to FIG. 1, there is shown a single crystal ingot 12 of semiconductor material. It could well be of a variety of different kinds of such material. However, for convenience of description and ease of understanding, the ingot will be assumed to be made of crystalline silicon, doped so as to be of P-type conductivity, and particularly adapted for manufacturing wafers to be used in producing single crystal silicon solar cells.

Such ingots are most typically grown by the well-known Czochralski process with a pre-determined type of crystal orientation. In accordance with this, the ingot 12 has been formed with a [100] type of crystal orientation.

The concept of a crystal orientation for an ingot of a material with a face-centered cubic structure such as silicon, is well understood by those skilled in the art. In accordance with this understanding, planes in the [100] grouping of planes will be perpendicular to the direction of elongation of the ingot; thus, the sawing of such an ingot transverse to that direction to form wafers will be along such planes. This orientation is convenient for the texturing of surfaces of semiconductor bodies formed from wafers of such an ingot. For example, the texturing of front and/or rear surfaces of crystalline solar cells, in certain circumstances, is considered to be advantageous.

It should be noted that in the sense used here and in the art, the class of [100] planes is considered not limited by a choice of origin, but encompasses the planes falling in the [100] plane system for a selected origin, and all equivalent planes from a crystallographic standpoint.

The ingot 12 has a curved elongated surface 14 along the direction of elongation and left and right end surfaces 16 and 20 (with reference to the view of FIG. 1). The ingot is shown in FIG. 1 substantially as grown (and removed from ingot growth apparatus). The direction of elongation is represented by the axial line 21 through the ingot for growth of the ingot (e.g. according to the Czochralski method which incorporates rotation about such an axis in growing the ingot). The curved elongated surface 14 provides roughly circular-shaped, but somewhat irregular cross-sections perpendicular to the direction of elongation. The irregular aspect, of course, is a natural consequence of the growth process.

As grown, the single crystll structure of the ingot 12 comes together to form well-defined node lines along outer surfaces of the rngot. The crystallographic characteristics of the growth determine that such lines are 90 degrees apart along outer surfaces of the ingot—running along the main curved surface 14 as well as along at least the left (starter) one 16 of the two end surfaces.

One such node line 22 (including along the shown part of the right end surface) shows up, almost completely, in the view of FIG. 1. Two end surface portions 24, along the left end surface 16, of two additional node lines, also appear in FIG. 1. The portion 26 of one of the latter node lines remaining after the end sawing of FIG. 1, is shown in FIG. 2, in which the ingot is rotated somewhat with respect to the view of FIG. 1. The node lines quite commonly may not appear along all or part of the right (finisher) end surface 20. The reason is that some structure at that end is quite commonly lost in the process of finishing the growth and removing the ingot from the growth apparatus.

Now returning to FIG. 1, in the figure, the left end surface 16 of the ingot 12 is being sawed off by movement of the ingot upwardly against a conventional rotating saw blade 28, charged along its cutting edge with diamond particles. Such sawrng provides a modified left end surface 30 (FIG. 2) which is approximately perpendicular to the direction of elongation of the ingot. In the ideal, this surface would be exactly perpendicular to that direction. But due to limitations in equipment and alignment, some meaningful error typically is a reality. The existence of such error is one reason for the advantages achieved with the present process. The upward movement arrow 32 of FIG. 1, of course, represents the upward movement of the ingot in accomplishing the end sawing.

After the sawing off of the left end surface 16, the ingot is moved lengthwise, and in similar fashion, the right end surface 20 is sawed-off to leave a modified right end surface (not shown) also approximately perpendicular to the direction of elongation of the ingot.

With respect to FIG. 1, using equally conventional techniques and equipment, alternatively, the saw could be moved downwardly through the ingot in achieving the sawing-off, as opposed to the ingot moving upwardly against the saw. In the sawing-off process of FIG. 1, typically, the ingot might be supported in a series of V-shaped supports therealong, with undesirable tilting of the ingot in the vertical direction being avoided by setting the positions of the V-shaped structures with regard to a reference plane. Undesirable "tilting" of the ingot along the horizontal direction may also be attempted to be minimized by attempting to vertically align node lines along the ingot end surfaces. Minimizing such tilting, in both respects, of course, is part of the procedure for obtaining modified end surfaces which are as close to perpendicular to the direction of elongation, as possible. One factor which can limit somewhat the usefulness of the node lines along the end surfaces in this respect is that the node lines sometimes take a slightly twisted orientation along the ingot as the ingot is grown. Such twisting would leave the node lines along the two end surfaces angularly displaced with respect to one another, thus limiting their usefulness in alignment of the ingot for the process illustrated in FIG. 1. Another factor is the somewhat common absence of the node lines on the right (finisher) end surface 20, as previously explained. However, it is again emphasized that the present process is particularly designed to take account of virtually unavoidable error of this type, reducing the loss of material due to such error.

Figure 12A:
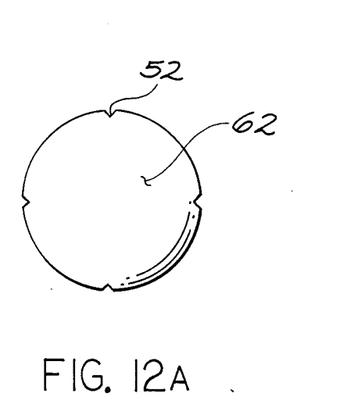
FIGS. 12A-12C are top, bottom and elevational views, respectively, of an ingot mounting structure not incorporating such lugs.
Figure 12B:
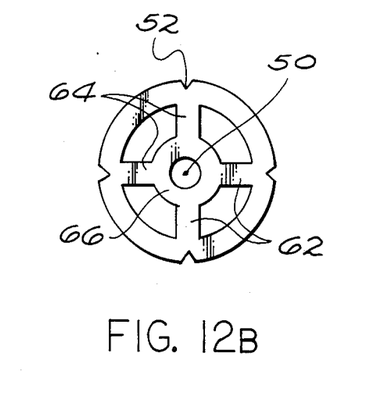
Figure 12C:
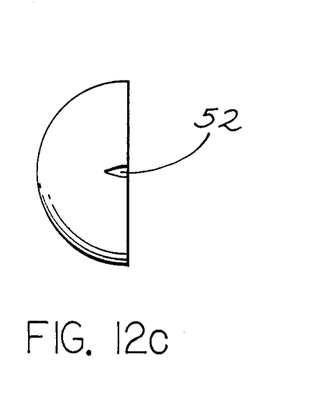

Now turning to FIG. 2, there is shown the ingot 12 having a lugged ingot mounting structure 34 mounted on the modified left ingot end surface 30 (see also FIGS. 11A—11C), and having a similar, but unlugged ingot mounting structure 36 mounted on the modified right end surface (see also FIGS. 12A—12C).

The method of centering the ingot mounting structures, for such mounting, is illustrated in FIG. 2, with reference to the detailed forms of the mounting structures, as shown in FIGS. 11A—11C and 12A—12C Specifically, as shown in FIG. 2, a pair of straight intersecting lines have been described (with a sharp tool appropriate for such scribing) along the modified left end surface 30 of the ingot. Thus there is a first scribe line 40 connecting the end positions 42 of two opposed ingot node lines and a second scribe line 44 connecting the end positions 46 of the second pair of ingot node lines. Then, the lugged ingot mounting structure 34 has been mounted (using a standard epoxy material, such as that sold by Loctite under its Designation No. 422) with its center position 47 over the point of intersection of the two scribe lines. Such is accomplished by aligning opposed notches 48 in the mounting structure along the scribe lines.

The mounting process for the unlugged ingot mounting structure 36 on the modified right ingot end surface is comparable, including the scribing of comparable scribe lines and placing the center position 50 of the structure over the intersection of such lines utilizing alignment of opposed notches 52 defined by the unlugged mounting structure. The opposed notches, defined by each mounting structure, as shown, are 180° apart along the mounting structure.

The forms for the mounting structures are well evident in FIGS. 11A–11C and 12A–12C. Referring to FIGS. 11A–11C, the lugged ingot mounting structure 34 has a hemispherical upper surface 53, apart from the breaks in the hemispherical shape therealong, resulting from a pair of lugs 54 projecting from such surface and the four notches 48 along the surface. As indicated, the notches are formed in the dome-shaped wall structure presenting the generally hemispherically-shaped upper surface. The thickness of that wall structure is essentially unchanged from the base through the top. There is linear rib-like internal wall structure, intersecting generally circularshaped internal wall structure, rising from the base to the dome which substantially strengthens the ingot-mounting structure as a whole. The base surfaces 62 of the lugs, as shown, form part of the base of the structure as a whole. The spherical shape, in itself, is an inherently strong configuration. The internal wall structure adds significant further strength.

Now referring to the unlugged ingot mounting structure 36, its form is comparable to that for the lugged ingot mounting structure, as just described, apart from the absence of the projecting lugs. Thus, there is an upper surface 62 that is semi-hemispherical apart from being broken by the four notches therealong, and linear, rib-like internal wall structure 64, along with generally circular-shaped internal wall structure 66, which adds substantial strength to the structure. Of course, such strength is of substantial importance when the ingot mounting structures are tightly mounted with substantial inward force in fixture structures such as those of FIG. 7 and FIG. 8.

The end fixture structures of FIG. 7 include an end fixture structure 68 for receiving the lugged ingot mounting structure 34, and an end fixture structure 70 for receiving the unlugged ingot mounting structure 36 (left and right end fixture structures, respectively, with reference to the view of FIG. 7). These end fixture structures are incorporated into ingot mounting and rotating apparatus otherwise constructed along conventional lines. As indicated by the two-headed arrow of FIG. 7, the right end fixture structure can be moved by the apparatus toward and away from the left end fixture structure along a fixed center line 74 for the apparatus. This, of course, is to clamp and unclamp an ingot in position. The left end fixture structure, on the other hand, does not incorporate that capability for movement. However, as indicated by the perpendicular axes 76 and the rotational arrow 80 therebetween, the apparatus provides this end fixture structure with the capability of being turned through an accurately defined angle of 90 degrees and then solidly and stably locked with the ingot in position in the end fixtures. The right end fixture structure 70, through a rotational mounting in the apparatus, is free to rotate the 90 degrees also. The seating of the ingot mounting structures in the end fixture structures 68 and 70 as well-illustrated by reference to FIGS. 7, 9A-B and 10.

Figure 9A:
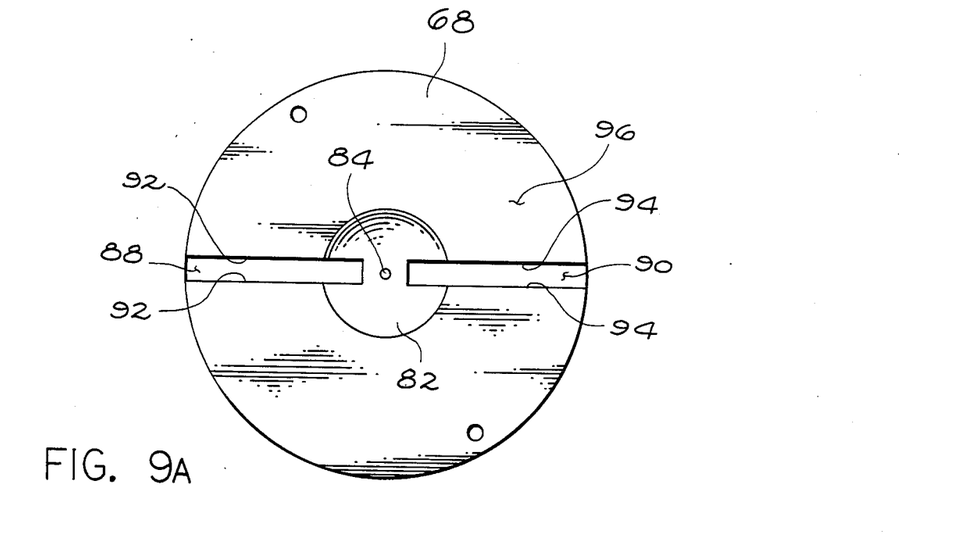
FIGS. 9A and 9B are front elevational views of the end fixture structures of FIG. 7.

Referring to FIGS. 9A and 9B, showing front views of the end fixture structures of FIG. 7, and referring first to the left end fixture structure 68, there is a central region surface whrch is conical, apart from an opening 84 for a nipple cavity 86 (see FIG. 10) at the apex, and apart from two slots which extend into the central region. The nipple cavity is to collect undesirable particles and the like which might tend to interfere with the desired seating of an ingot mounting structure in the fixture structure. The two slots are a left slot 88 and a right slot 90 with reference to the view of FIG. 9A. As is evident in FIG. 9A and FIG. 10 (in which the end fixture structure is rotated so that the slots are vertical), these slots are to receive the lugs 54 of the lugged ingot mounting structure 34. The side wall structure 92 for the left slot and side wall structure 94 for the right slot, then, serves to turn the mounting structure by abutting against the lugs, as the fixture structure rotates, in accomplishing the rotation of the ingot during processing of the ingot. The left end fixture structure also has a planar outer surface region 96.

Figure 9B:
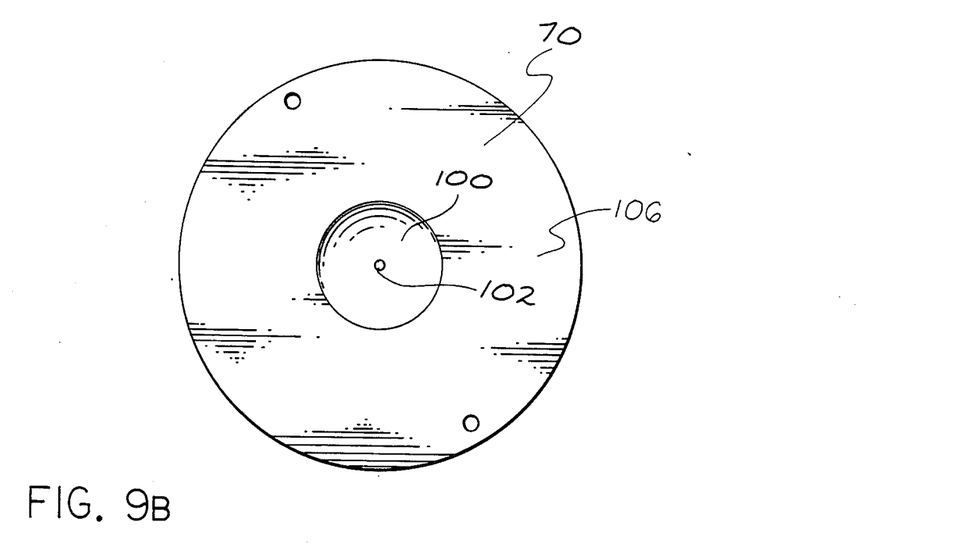

Now turning to the right end fixture structure 70, it has a central region surface 100 that is essentially the same as the central region surface of the left end fixture structure except for the absence of slots. Thus, the central region surface for the right end fixture has a conical shape, solely apart from an opening 102, at the apex, for a nipple cavity 104 (FIG. 7) which is essentially the same as the nipple cavity for the left end fixture structure. The right end fixture structure also has a planar outer surface region 106 that is essentially the same as the corresponding region for the left end fixture structure, apart from the absence of the slots for the right end fixture structure.

Figure 10:
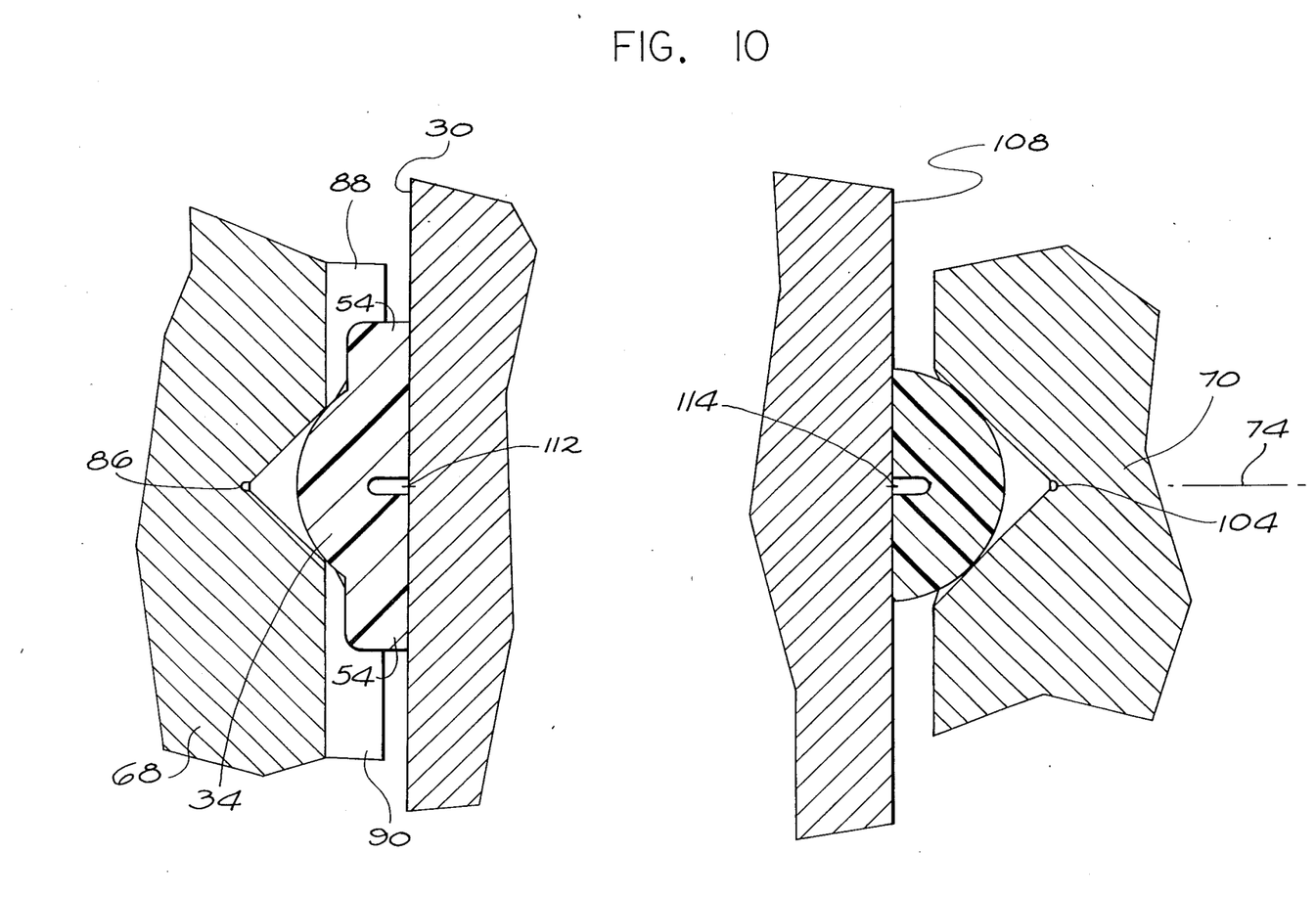
FIG. 10 is a fragmentary cross-sectional view showing the mounting of the ingot in the end fixture structures of FIG. 7.

By reference to FIG. 10, it will be apparent that the conical surface portions for the end fixture structures and the spherical surface portions for the ingot mounting structures are positioned against one another to mount the ingot and to tightly hold the ingot in the end fixtures. An angle between the center line 74 of the apparatus (also the axis for the conical shape), and the cone-shaped surfaces, of 45 degrees has been found to be convenient and satisfactory, although this could differ with varying requirements.

The importance of the interaction between the ingot mounting structures and the end fixture structures, in particular between the spherical surface portions and conical surface portions, can be appreciated by reference to FIG. 10. Specifically, the shapes and relationships essentially serve to center the ingot in a manner desirable for processing even where the modified left end surface 30 and the modified right end surface 108 are somewhat off their ideal perpendicular orientations with respect to the direction of elongation of the ingot. That direction of elongation, as previously noted, is represented by the axial line 21 of FIG. 1 (the nominal center line for the ingot as it is grown).

The position 112 of the intersection of the scribe lines 40 and 42 along the modified left end surface 30 is indicated in FIG. 10. Similarly, the position 114 of the intersection of the corresponding scribe lines along the modified right end surface is also shown. The interaction of the spherical and conical shapes serve to essentially place these positions along the center line 74 for the end fixture structures even where there is a degree of error in the desired perpendicular orientation of the modified end surfaces with respect to the direction of elongation. Thus, in effect, it serves to essentially center the ingot in the end fixture structures, and thus in the apparatus of which the end fixture structures are a part, for processing the ingot in the apparatus. This is considered to be an extremely desirable way to position the ingot so as to reduce waste of valuable ingot material in the processing of the ingot.

In FIG. 10, it is apparent that the depth of the lugs is significantly less than the depth of the slots 88 and 90 of the left end fixture structure 68. The reason for this is to assure that the clamping of the ingot is through the abutting interaction of the spherical surface portions of the ingot mounting structures and the conical surface portions of the end fixture structures, without interference from the lugs. Thus, seating of the lugs against the bottom of the slot is avoided. Of course, there is a tolerance in the off-perpendicular character of the modified ingot end surfaces which, if exceeded, is beyond the capability of the ingot mounting structures and end fixture structures. For example, if the modified left end surface were too far off the perpendicular, one of the lugs typically might seat against the bottom of one of the slots, thus interfering with the desired alignment capability of the ingot mounting structures and end fixture structures.

The use of spherical and conical surface portions, as shown, has been found to be extremely convenient and practical. That the spherical surface portions are on the ingot mounting structure and are convex, and the conical surface portions are on the end fixture structures and are concave, has also been found to be convenient and extremely practical. However, other shapes and arrangements, of course, are possible in accordance with the same principle.

Simply by way of example, ingot mounting structures having concave conical surface portions could be employed with end fixture structures having convex spherical surface portions. Also, spherical surface portions could be employed on both, concave on one and convex on the other, in accordance worth the same principle. However, practical difficulties are much greater with spherical surface portions on both. Specifically, where a conical surface portion is employed, the actual abutting surface is of a ring-like shape. From a practical standpoint, this is considered advantageous over an actual abutting surface that would be of a spherical shape in the case of abutting spherical surface portions.

Referring again to FIG. 10, it has also been found to be convenient and practical to have the slots 88 and 90 of the left end fixture structure of such a depth that the floors of the slots intersect the conical surface portion at a position somewhat below the typical position where the ingot mounting structures seat against the conical surface portion. This is evident at the left in FIG. 10.

Now returning to FIG. 3, the ingot is clamped (as is schematically shown) in the end fixture structures 68 and 70 of two-bladed slabbing apparatus to concurrently saw the ingot along its direction of elongation to provide planar elongated ingot surfaces. The apparatus has two saw blades which tuin concurrently on a single shaft. The saw blades are conventionally charged with diamond particles, as is typical in sawing semiconductor material.

As indicated by the movement arrow 116, the firmly mounted ingot axially moves through the saw blades. However, alternatively, the apparatus could incorporate blades which move through an ingot which remains fixed. FIG. 3 illustrates the sawing, at one pair of positions, along the direction of elongation to provrde one pair of at least approximately parallel elongated ingot surfaces. The saw blades typically angle outwardly somewhat as they saw through an ingot in the manner of FIG. 3. As the blades grow older, this generally becomes more pronounced. That, by way of example, is one typical, potentially significant form of error which is encountered in achieving ideal parallel ingot surfaces.

After the first pass of FIG. 3, as previously indicated and for example represented in FIG. 7 by the perpendicular axes 76 and rotational arrow 80, the ingot is rotated 90 degrees. Then the rotated ingot is again moved through the rotating saw blades. Thus, the ingot is sawed along the direction of elongation, at another pair of positions, to provide another pair of approximately parallel elongated ingot surfaces which are approximately perpendicular to the initially cut surfaces.

Turning next to FIG. 4, that figure illustrates a refining of the cut elongated ingot surfaces which can be performed if the surfaces are beyond the tolerances required after the sawing by the two-bladed saw. Whether the step of FIG. 4 is performed can vary from ingot to ingot. Also, as already indicated, as the blades grow older, there is a greater likelihood that the step of FIG. 4 will be performed.

FIG. 4 shows the ingot 12 just as the further refining is being initiated. The shape of the cut ingot thus is well evident. There is the one pair of opposed elongated ingot surfaces 120 and the other pair 122. As is evident in FIG. 4, the positions of sawing were selected to leave curved ingot surface portions 124 between the planar elongated surfaces. This leaving of such portions, along with the performing of the sawing of FIG. 3 before grinding the curved elongated ingot surface 14 (FIG. 1) to round off its irregularities, is a significant factor in reducing the waste of the valuable semiconductor material.

By way of example, in a particular implementation of the process herein, for ingots in the range of about four or five inches in nominal diameter, a tolerance of about 5 mils in the desired orientation of a cut elongated ingot surface is considered acceptable. By this , it is meant that starting at one corner, an adjacent corner should be about 5 mils or less away from the position where it would be for an ideally oriented plane. In the present process, that can often be achieved without the additional processing of FIG. 4. However, with the additional processing of FIG. 4, tolerances signficantly better than that normally can be achieved.

The processing of FIG. 4 is a conventional surface grinding to thus enhance the parallel relationships of the opposed, cut surfaces and the perpendicular relationship between the two pairs of such surfaces. It employs standard apparatus having a wheel 126 carrying a diamond refining ring 128. The wheel, as indicated by the arrows, is moved downward, pushing the ring against the surface to be refined and is rotated while the ingot, in a generally L-shaped holder 130, is held with a clamping force represented by the clamping arrow 132 along another surface. The holder is held to a rotating base 134 by magnetic force between the base and the holder.

The clamping force pushes the opposed elongated surface against three button-like projections along the inside wall of the holder adjacent that surface. (Two projections at one end are shown, with a third projection at the other end, between the vertical positions of the other two, not shown). At the bottom of the holder, the ingot surface opposite the bottom is concurrently balanced on two intermediate button-like projections, one at each end, along the bottom of the holder (one shown). As previously indicated, this is a standard technique. Prior to initiating the processing of FIG. 4, standard measurements would be made of the ingot to determine which adjacent cut planes form the best corner. Those two planes, then, would be the planes against the buttons of FIG. 4 at the outset of the process.

After an initial surface is refined (that being the top surface in FIG. 4), the ingot is rotated so that the refined surface becomes the generally vertical surface against three holder projections which is critical to aligning the ingot in the holder. Then, the process is continued for refining additional surfaces, each time using as the critical aligning surface the surface which has just been refined. As indicated, this essentially conventional sort of refining, by surface grinding, can readily meet typical tolerances which are relevant with respect to the present method of manufacture.

The rounding off of the irregular curved elongated ingot surface portions 124 is illustrated rn FIG. 5. End fixture structures for grinding apparatus used for this purpose, are shown in FIG. 8. Apart from the end fixture structures, such grinding apparatus is constructed along conventional lines.

With reference to the view of FIG. 8, there thus is a left end fixture structure 136 for the lugged ingot mounting structure 34, and a right end fixture structure 140 for the unlugged ingot mounting structure 36. Although the end fixture structures for the grinding operation do have a somewhat different appearance than those for the slabbing operation, in the respects relevant herein, they are essentially the same. Specifically, on the grinding apparatus the right end fixture structure 140 has the capability for axial movement, as indicated by the movement arrow 142, to accomplish the clamping of the ingot. Further, the left end fixture structure does not have such capability; however, as indicated by the rotational arrow 144, it is the fixture structure for rotationally driving the ingot through the lugged ingot mounting structure which is mounted on this fixture structure. Of course, in this grinding operation, the rotational operation is a continuing rotation, one revolution after the next, rather than simply a rotation through 90 degrees, as in the slabbing operation.

The surfaces relevant to seating the ingot mounting structures against the grinder end fixture structures are essentially the same in all respects as those for the previously described end fixture structures for the slabbing apparatus. Thus, the view of FIG. 10, although described as showing the interaction between the ingot mounting structures and end fixture structures for the slabbing operation, in fact, shows equally well such interaction for the grinding operation. Similarly, the views of FIGS. 9A and 9B and the description thereof, essentially are also equally applicable to the end fixture structures for the grinding, with two exceptions. One exception, readily evident in FIG. 8, is that the flat outer surface region for the grinder end fixture structures is of a much smaller size and the slots of the left structure correspondingly are of less length than in the case of the slabber fixture structures. Simply, different sizes (along with different thicknesses for the ends of the fixture structures which contain the relevant mounting surfaces) have been found convenient and practical for slabbing and grinding, and for incorporation in slabbing and grinding apparatus.

The other exception concerns a matter not previously noted with regard to the end fixture structures for the slabbing apparatus. Specifically, as shown in FIGS. 9A and 9B, each has a pair of opposed screw holes near the outside circumference. These holes are present in the event that, for some reason, the holding of the ingot in the slabbing apparatus is not sufficiently stable by virtue of clamping by the end fixtures alone. In that case, screws can be threaded through the screw holes into the end of the ingot to provide added stability. In practice, this has generally not been found to be necessary. Such screw holes are not even present in the end fixture structures for the grinding operation in that there is little likelihood that additional stability would be a requirement.

With respect to the end fixture structures for the grinding operation, the slot openings in the left end fixture structure 136 are readily apparent in FIG. 8, as are the conical surface portion 148 and nipple cavity 150 of the right end structure. The tapered portions of these structures, at their non-mounting ends are conventionallly constructed so that they fit, for rotational purposes, in conventional mating cavities for secure and stable rotation. The threaded structures, simply, are to receive nuts which can be turned to force the end fixtures out when it is desired to remove them from the tightly-fitting mating cavities in which they are mounted. The centerline (axis of rotation) for these end fixture structures is shown at 152 in FIGS. 8 and 5. The centerline 152, with regard to the view of FIG. 10, of course corresponds to the centerline 74 of that figure.

The grinding operation of FIG. 5 involves a standard rotating cup having a diamond grinding ring 156 at its grinding end. With the ingot rotating and moving along the axis for the apparatus, the cup is positioned so as to grind the irregular curved ingot surface portions 124 between the opposed elongated planar surfaces to a uniform round shape. The end result is ingot surface portions between planar surface portions that essentially, in cross-section, fall along a circle. As is apparent by reference to FIG. 5, this ordinarily entails grinding off small portions of the planar surfaces at their edges.

Quite typically, the diamond cup may be positioned for a first pass by the ingot so as to approach the desired result. Then the ingot can be measured along the areas where no grinding occurred to determine how much closer the ingot should be moved to the cup to provide the uniform rounded surface. By way of example, in a specific implementation employing ingots grown within the range of about 200 mils (along the diameter) to spare, the first pass might involve a grinding set at in the range of about 60 mils inward from the nominal position of the grown ingot surface. Then "room" for up to about an additional 40 mils would be available for the second pass. Of course, the apparatus could readily be adapted so that the cup moves along the ingot rather than the ingot moving along the cup, to accomplish the desired grinding.

Figure 6:
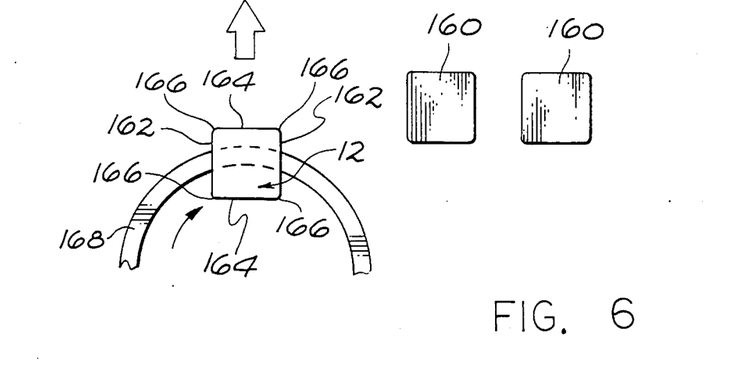
FIG. 6 is a generally schematic view showing the sawing off of wafers from the ingot.

Now referring to FIG. 6, the ingot 12 is shown in the process of having wafers 160 sliced therefrom in a further sawing operation. The ingot, due to the processing which has been described, has one pair of essentially parallel elongated ingot surfaces 162, and another pair of such surfaces 164, essentially perpendicular to the first pair. The ingot also has regular, rounded corner regions 166 between the parallel surfaces. The shape of the wafers 160, as sliced off from the ingot then matches a desirable shape, e.g., for crystalline semiconductor solar cells. These wafers, of course, are ready for further processing into such solar cells or other semiconductor devices in accordance with well-known methods.

The representation of FIG. 6 incorporates an inner diameter rotating saw blade 168 charged with diamond particles through which the ingot moves, to saw off the wafers. Such sawing operation and such sawing apparatus are fully conventional and well known. Alternatively, the saw blade could be moved through the ingot. Also, other saw blades could be employed such as a conventional outer diameter saw blade charged with diamond particles.

With regard to the ingot mounting structures 34 and 36, a polycarbonate material has been found to be convenient and practical for use in forming the such structures. Such a polycarbonate sold under the trademark Lexan (General Electric) has been found to be satisfactory. Employing a black filler with the polycarbonate material, to color it black, also nas been found to be convenient and helpful in giving the material coloring that facilitates viewing the ingot mounting structures. The ingot mounting structures are disposable in that they are used on one ingot and then disposed of. The material and cost of formation makes this disposable aspect eminently reasonable.

Several additional matters are somewhat noteworthy. worthy. First, the off-perpendicular error in the sawing to provide the modified ingot end surfaces has been noted as being a significant area of concern, and an area in which the present process is advantageous. In an implementation in accordance with what is described herein, such off-perpendicular error typically in the range of about 90 mils, and up to the range of about 200 mils, has been generally encountered. This refers to the distance off of a perpendicular position that one point along the outer edge of the surface might be with respect to an opposed point along such edge. In addition, particularly for example with respect to the end fixture structure for the slabbing operation that is axially moved for clamping and unclamping, at times when it is axially moved one may desire to avoid rotation of it. To accomplish this, it, for example, can be formed with one peripheral portion having a flat rather than the circular edge. Then, for example, a flat plate on the associated apparatus can be slid over the flat portion when it is desired to prevent such rotation.

In any case, it will be appreciated that many variations and changes may be made in the process which has been described without departing from the scope or spirit of the invention.

What is claimed is:

1. A method of manufacturing wafers of semiconductor material, comprising the steps of:
providing an elongated ingot of semiconductor material having a curved surface along the direction of elongation and end surfaces;
mounting a structure for ingot mounting on each of said end surfaces of said ingot;
positioning said ingot mounting structures on fixture structures to mount said ingot; and
rotating said mounted ingot, including rotationally driving wall structure of a said fixture structure defining a cavity against a projection of a said ingot mounting structure in said cavity.

2. A method of manufacturing wafers of semiconductor material, comprising the steps of:
providing an elongated ingot of semiconductor material having a curved surface along the direction of elongation and end surfaces;
mounting a structure for ingot mounting, defining a substantially spherical surface portion of said structure, on each of said end surfaces of said ingot;
positioning said ingot mounting structures on fixing structures to mount said ingot; and rotating said mounted ingot.

3. A method of manufacturing wafers of semiconductor material as defined in claim 2 wherein said fixture structures include a pair of end fixture structures each defining a substantially conical surface portion to abut a substantially spherical surface portion of a said ingot mounting structure.

4. A method of manufacturing wafers of semiconductor material as defined in claim 3 wherein each of said ingot mounting structures defines a convex substantially spherical surface portion and each of said end fixture structures defines a concave substantially conical surface portion.

5. A method of manufacturing wafers of semiconductor material, comprising the steps of:
providing an elongated ingot of semiconductor material having a curved surface along the direction of elongation and end surfaces;
mounting a structure for ingot mounting on each of said end surfaces of said ingot;
positioning said ingot mounting structures on fixture structures to mount said ingot, including positioning substantially spherical surface portions of said ingot mounting structures against substantially conical surface portions of said fixture structures; and
rotating said mounted ingot.

6. A method of manufacturing wafers of semiconductor material as defined in claim 5 wherein said substantially spherical surface portions of said ingot mounting structures are convex and said substantially conical surface portions of said fixture structures are concave.

7. A method of manufacturing wafers of semiconductor material, comprising the steps of:
providing an elongated ingot of semiconductor material having a curved surface along the direction of elongation and end surfaces;
mounting a sturcture for ingot mounting on each of said end surfaces of said ingot, a said ingot mounting structure defining a projection;
positioning said ingot mounting structures on fixture structures to mount said ingot, a said fixture structure having wall structure defining a cavity to receive said projection of said ingot mounting structure and to rotationally drive said ingot mounting structure and said ingot; and
rotating said mounted ingot.

8. A method of manufacturing wafers of semiconductor material, comprising the steps of:
providing an elongated ingot of semiconductor material having a curved surface along the direction of elongation and end surfaces;
mounting a structure for ingot mounting on each of said end surfaces of said ingot, said ingot mounting structure for each of said end surfaces defining a first pair of opposed notches and a second pair of opposed notches for positioning said structure for said mounting;
positioning said ingot mounting structures on fixture structures to mount said ingot; and
rotating said mounted ingot.

9. A method of manufacturing wafers of semiconductor material, comprising the steps of:
providing an elongated ingot of semiconductor material having a curved surface along the direction of elongation and end surfaces;
sawing off said end surfaces at least approximately perpendicularly to the direction of elongation to define modified end surfaces at least approximately perpendicular to the direction of elongation;
mounting a structure for ingot mounting on each of said modified end surfaces;
positioning said ingot mounting structure on fixture structures to mount said ingot, including positioning substantially spherical surface portions of said ingot mounting structures against substantially conical surface portions of said fixtures structures;
sawing along the direction of elongation through said ingot at, at least one position to provide at least one substantially planar ingot surface along the direction of elongation;
rotating said mounted ingot;
sawing along the direction of elongation through said ingot at, at lest one other position to provide at least one other substantially planar ingot surface along the direction of elongation.

10. A method of manufacturing wafers of semiconductor material as defined in claim 9 wherein said substantially spherical surface portions of said ingot mounting structures are convex and said substantially conical surface portions of said fixture structure are concave.

11. A method of manufacturing wafers of semiconductor material, comprising the steps of:
providing an elongated ingot of semiconductor material having a curved surface along the direction of elongation and end surfaces;
sawing off said end surfaces at least approximately perpendicularly to the direction to elongation to define modified end surfaces at least approximately perpendicular to the direction of elongation;
mounting a structure for ingot mounting on each of said modified end surfaces;
positioning said ingot mounting structures on fixture structures to mount said ingot;
sawing along the direction of elongation through said ingot at, at least one position to provide at least one substantially planar ingot surface along the direction of elongation;
rotating said mounted ingot, including rotationally driving wall structure of a said fixture structure defining a cavity against a projection of a said ingot mounting structure in said cavity;

sawing along the direction of elongation through said ingot, at, at least one other position to provide at least one other substantially planar ingot surface along the direction of elongation.

12. A method of manufacturing wafers of semiconductor material, comprising the steps of:

providing an elongated ingot of semiconductor material having a curved surface along the direction of elongation and end surfaces;

sawing off said end surfaces at least approximately perpendicularly to the direction of elongation to define modified end surfaces at least approximately perpendicular to the direction of elongation;

mounting a structure for ingot mounting, defining a substantially spherical surface portion of said structure, on each of said modifies end surfaces;

positioning said ingot mounting structures on fixture structures to mount said ingot;

sawing along the direction of elongation through said ingot at, at least one position to provide at least one substantially planar ingot surface along the direction of elongation;

rotating said mounted ingot;

sawing along the direction of elongation through said ingot at, at least one other position to provide at least one other substantially planar ingot surface along the direction of elongation.

13. A method of manufacturing wafers of seminconductor material as defined in claim 12 wherein said fixture structures include a pair of end fixture structure each defining a substantially conical surface portion to abut a substantially spherical surface portion of a said inogt mounting structure.

14. A method of manufacturing wafers of semiconductor material as defined in claim 13 wherein each of said ingot mounting structures defines a convex substantially spherical surface portion and each of said end fixture structures defines a concave substantially conical surface portion.

15. A method of manufacturing wafers of semiconductor material, comprising the steps of:

providing an elongated ingot of semiconductor material having a curved surface along the direction of elongation and end surfaces;

sawing off said end surfaces at least approximately perpendicularly to the direction of elongation to define modified end surfaces at least approximately perpendicular to the direction fo elongation;

mounting a structure for ingot mounting on each of said modified end surfaces, a said ingot mounting structure defining a projection;

positioning said ingot mounting structures on fixture structures to mount said ingot, a said fixture structure having wall structure defining a cavity to receive said projection of said ingot mounting structure and to rotationally drive said ingot mounting structure and said ingot;

sawing along the direction of elongation through said ingot at, at least one position to provide at least one substantially planar ingot surface along the direction of elongation;

rotating said mounted ingot;

sawing along the direction of elongation through said ingot at, at least one other position to provide at least one other substantially planar ingot surface along the direction of elongation.

16. A method of manufacturing wafers of semiconductor material, comprising the step of:

providing an elongated ingot of semiconductor material having a curved surface along the direction of elongation and end surfaces;

sawing off said end surfaces at least approximately perpendicularly to the direction of elongation to define modified end surfaces at least approximately perpendicular to the direction of elongation;

mounting a structure for ingot mounting on each of said modified end surfaces, said ingot mounting structure for each of said end surfaces defining a first pair of opposed notches and a second pair of opposed notches for positioning said structure for said mounting;

positioning said ingot mounting structures on fixture structures to mount said ingot;

sawing along the direction of elongation through said ingot at, at least one position to provide at least one substantially planar ingot surface along the direction of elongation;

rotating said mounted ingot;

sawing along the direction of elongation through said ingot at, at least one other position to provide at least one other substantially planar ingot surface along the direction of elongation.

17. A method of manufacturing wafers of semiconductor material, comprising the steps of:

providing an elongated ingot of semiconductor material having a curved surface along the direction of elongation and end surfaces;

marking, at each of said end surface of said elongated ingot, along first and second straight paths between positions of node lines along said ingot at said surface;

mounting a structure for ingot mounting on each of said end surfaces of said ingot, including positioning said ingot mounting structure opposite an intersection of said paths for said end surface;

positioning said ingot mounting structures on fixtures structures to mount said ingot; and rotating said mounting ingot.

18. A method of manufacturing wafers of semiconductor material as defined in claim 17, comprising the additional steps of:

releasing said positioned ingot mounting structures and removing said ingot from said fixture structures; and positioning, a second time, said mounting structures on fixture structures to mount said ingot; and rotating said mounted ingot a second time.

19. A method of manufacturing wafers of semiconductor material as defined in claim 17 wherein said positioning of said ingot mounting structure includes centering said ingot mounting structure substantially on said intersection of said paths for said end surface.

20. A method of manufacturing wafers of semiconductor material as defined in claim 19 wherein said centering of said ingot mounting structure includes aligning notches defined by said ingot mounting structure substantially along said paths for said end surface.

21. A method of manufacturing wafers of semiconductor material, comprising the steps of:

providing an elongated ingot of semiconductor material having a curved surface along the direction of elongation and end surfaces;

sawing off said end surfaces at least approximately perpendicularly to the direction of elongation to define modified end surfaces at least approximately perpendicular to the direction of elongation;

marking, at each of said modified end surfaces, along first and second straight paths between positions of node lines along said ingot at said end surface;

mounting a structure for ingot mounting on each of said modified end surfaces, including positioning said ingot mounting structure opposite an intersection of said paths for said end surface;

positioning said ingot mounting structures on fixture structures to mount said ingot;

sawing along the direction of elongation through said ingot at, at least one position to provide at least one substantially planar ingot surface along the direction of elongation;

rotating said mounted ingot;

sawing along the direction of elongation through said ingot at, at least one other position to provide at least one other substantially planar ingot surface along the direction of elongation.

22. A method of manufacturing wafers of semiconductor material as defined in claim 21, comprising the additional steps of:

releasing said positioned ingot mounting structures and removing said ingot from said fixture structures; and positioning, a second time, said mounting structures on fixtures structures to mount said ingot.

23. A method of manufacturing wafers of semiconductor material as defined in claim 21 wherein said positions of said sawing along the direction of elongation are selected to leave curved ingot surface portions between said substantially planar ingot surfaces, and comprising the additional steps of:

releasing said positioned ingot mounting structures and removing said ingot from said fixture structures;

positioning, a second time, said mounting structures on fixture structures to mount said ingot; and grinding said curved ingot surface portions between said substantially planar ingot surface portions.

24. A method of manufacturing waferse of semiconductor material as defined in claim 23 wherein said grinding step includes rotating said mounted ingot.

25. A method of manufacturing wafers of semiconductor material as defined in claim 21 wherein said positioning of said ingot mounting structure includes centering said ingot mounting structures substantially on said said intersection of said paths for said end surface.

26. A method of manufacturing wafers of semiconductor material as defined in claim 25 wherein said centering of said ingot mounting structure includes aligning notches defined by said ingot mounting structure substantially along said paths for said end surface.

27. A method of manufacturing wafers of semiconductor material as defined in claim 21, comprising the additional step of:

repeatedly sawing through said ingot transverse to the direction of elongation.

28. A method of manufacturing wafers of semiconductor material as defined in claim 21 wherein, one said sawing step along the direction of elongation includes substantially concurrently sawing along the direction of elongation at, at least a first pair of positions to provide a first pair of at least approximately parallel elongated ingot surfaces, and the other said sawing step along the direction of elongation includes substantially concurrently sawing along the direction of elongation at, at least a second pair of positions to provide a second pair of at least approximately parallel elongated ingot surfaces, said second pair of elongated ingot surfaces being at least approximately perpendicular to said first pair of elongated ingot surfaces, said positions of said substantially concurrent sawing steps being selected to leave curved ingot surface portions between said pairs of elongated ingot surfaces, and comprising the additional step of:

repeatedly sawing through said ingot transverse to the direction of elongation to provide a plurality of semiconductor wafers having at least a first pair of at least approximately parallel sides, a second pair of at least approximately parallel sides at least approximately perpendicular to said first pair of sides, and curved circumferential portions between said pairs of sides.

29. A method of manufacturing wafers of semiconductor material as defined in claim 28, comprising the additional step of:

grinding said curved ingot surface portions between said pairs of elongated ingot surfaces.

30. A method of manufacturing wafers of semiconductor material as defined in claim 29 wherein said grinding step includes rounding off said curved ingot surface portions.

31. A method of manufacturing wafers of semiconductor material as defined in claim 29, comprising the additional step of:

grinding said elongated ingot surfaces to enhance the accuracy of said at least approximately parallel orientations of each of said pairs of elongated surfaces.

* * * * *